US008259485B2

(12) United States Patent
Yang et al.

(10) Patent No.: US 8,259,485 B2
(45) Date of Patent: Sep. 4, 2012

(54) MULTILAYER STRUCTURES HAVING MEMORY ELEMENTS WITH VARIED RESISTANCE OF SWITCHING LAYERS

(75) Inventors: Jianhua Yang, Palo Alto, CA (US); Wei Wu, Palo Alto, CA (US); John Paul Strachan, Millbrae, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 59 days.

(21) Appl. No.: 12/873,084

(22) Filed: Aug. 31, 2010

(65) Prior Publication Data

US 2012/0051125 A1    Mar. 1, 2012

(51) Int. Cl.
    *G11C 11/00*    (2006.01)
(52) U.S. Cl. ........................................................ 365/148
(58) Field of Classification Search ................... 365/148
    See application file for complete search history.

(56) References Cited

U.S. PATENT DOCUMENTS

| | | | |
|---|---|---|---|
| 6,867,996 B2 | 3/2005 | Campbell et al. | |
| 7,221,600 B2 | 5/2007 | Hara et al. | |
| 7,491,962 B2 | 2/2009 | Liu et al. | |
| 7,579,611 B2* | 8/2009 | Lam et al. | 257/2 |
| 7,863,087 B1* | 1/2011 | Kumar et al. | 438/104 |
| 2008/0304308 A1* | 12/2008 | Stipe | 365/51 |
| 2009/0174032 A1* | 7/2009 | Maejima et al. | 257/536 |
| 2009/0194764 A1 | 8/2009 | Lee et al. | |
| 2009/0231083 A1 | 9/2009 | Hosoi et al. | |
| 2009/0250678 A1 | 10/2009 | Osano et al. | |
| 2010/0046275 A1 | 2/2010 | Hosono et al. | |
| 2011/0044092 A1* | 2/2011 | Ono et al. | 365/148 |
| 2011/0134681 A1* | 6/2011 | Nagashima et al. | 365/148 |

* cited by examiner

*Primary Examiner* — Hoai V Ho
*Assistant Examiner* — Min Huang

(57) ABSTRACT

A multilayer structure is provided that includes a base and a multilayer circuit disposed above the base. The multilayer circuit includes memory elements, each including a switching layer, and conductive lines leading from the base to the memory element. The total resistance of the switching layer of a memory element is varied based on the total resistance of conductive lines leading from the base to the memory element.

21 Claims, 6 Drawing Sheets

MULTILAYER STRUCTURES HAVING MEMORY ELEMENTS WITH VARIED RESISTANCE OF SWITCHING LAYERS

STATEMENT OF GOVERNMENT INTEREST

This invention was made with government support. The government has certain rights in the invention.

BACKGROUND

Three-dimensional (3D) circuits containing stacked, multiple layers of interconnected circuitry provide potential solutions for increasing the performance and planar density of integrated circuits. An example of such a 3D circuit is a memory circuit that is comprised of multiple layers of interconnected memory elements, each layer being an interconnected two-dimensional array (2D) of the memory elements. The electrical properties of a memory element, such as its internal voltage for a given external voltage applied to the multilayer structure, can vary depending on the position of the memory element in the multilayer structure. As a result, the performance of the memory circuit can be affected. A memory circuit having a multilayer architecture of memory elements that present uniform electrical properties, including uniform internal voltages, regardless of position in the multilayer structure, for a given external applied voltage, would be beneficial.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
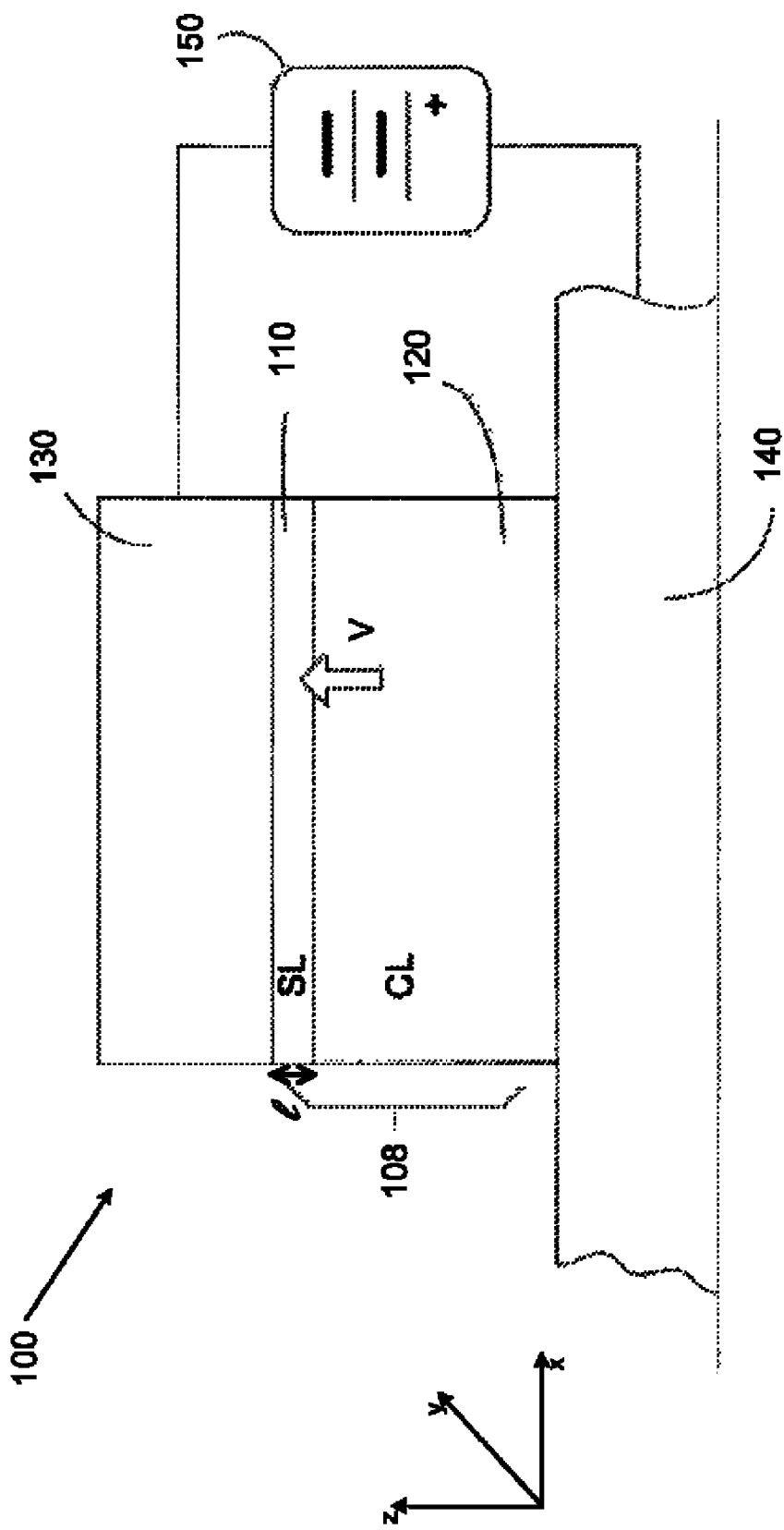
FIG. 1 illustrates a cross-sectional view of an example memory element.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment or example, but not necessarily in other embodiments or examples. The various instances of the phrases "in one embodiment," "in one example," or similar phrases in various places in the specification are not necessarily all referring to the same embodiment or example.

A "computer" is any machine, device, or apparatus that processes data according to computer-readable instructions that are stored on a computer-readable medium either temporarily or permanently. A "software application" (also referred to as software, an application, computer software, a computer application, a program, and a computer program) is a set of instructions that a computer can interpret and execute to perform one or more specific tasks. A "data file" is a block of information that durably stores data for use by a software application.

The term "computer-readable medium" refers to any medium capable storing information that is readable by a machine (e.g., a computer). Storage devices suitable for tangibly embodying these instructions and data include, but are not limited to, all forms of non-volatile computer-readable memory, including, for example, semiconductor memory devices, such as EPROM, EEPROM, and Flash memory devices, magnetic disks such as internal hard disks and removable hard disks, magneto-optical disks, DVD-ROM/RAM, and CD-ROM/RAM.

As used herein, the term "includes" means includes but not limited to, the term "including" means including but not limited to. The term "based on" means based at least in part on.

A multilayer structure including multiple layers of interconnected circuitry can provide potential solutions for increasing the performance and planar density of integrated circuits. A non-limiting example of such a multilayer structure is a memory circuit that is comprised of multiple layers of interconnected memory elements, each layer of the multilayer structure being an interconnected two-dimensional array (2D) of the memory elements. The electrical properties of a memory element can vary depending on its position in the multilayer structure. As a non-limiting example, for a given external voltage applied to the multilayer structure, the internal voltage of a memory element positioned in a lower layer of the structure (relative to the base of the multilayer structure) can differ from the internal voltage of a memory element positioned in a higher layer. As a result, the performance of the multilayer structure can be affected. Provided herein are multilayer structures including multiple layers of interconnected memory elements that present uniform electrical properties, including uniform internal voltages, regardless of position in the multilayer structure, for a given external applied voltage.

FIG. 1 shows an example of a memory element 100 that is interconnected to provide the multilayer structure. The memory element includes electrodes 130, 140 and an active region 108. As illustrated in FIG. 1, the memory element active region 108 of the switching device includes a switching layer ("SL") 110, and a conductive layer ("CL") 120. The switching layer 110 is formed of a switching material, while the conductive layer 120 is formed of a dopant source material. Typically, the switching material is an electronically insulating, semiconducting, or a weak ionic conductor. For example, the switching material can be a highly insulating stoichiometric compound. Examples of the switching material include a carbonate of silicon (including $SiCO_4$), an oxide of titanium (including $TiO_2$), a nitride of aluminum (including AlN), an oxide of silicon (including $SiO_2$), an oxide of hafnium, and an oxide of zirconium. The dopant source material is the source of the doping species for the switching material. That is, the dopant source material includes a relatively high concentration of dopants of the type that can be transported by the switching material used. For example, the dopant source material may be the same as the switching material but with a concentration of dopants. Examples of dopant source material include titanium sulphide, titanium phosphide, $TiO_{2-x}$ (0<x<1), $AlN_{1-w}$ (0<w<0.2), a plenary system (e.g., $SrTiO_{1-y}$ (0<y<0.2)), or a quaternary system. The type of dopant (depicted as a "V" in FIG. 1) depends on the type of dopant source material and switching material used. For example, in a system where the dopant source material $AlN_{1-w}$ is used with switching material AlN, the dopant is nitrogen vacancies. As another example, where the dopant source material $TiO_{2-x}$ is used with switching material $TiO_2$, the dopant is oxygen vacancies. Non-limiting examples of other suitable active region materials combinations and the dopant for a given combination are given in Table 1.

TABLE 1

Examples of Switching Materials, Dopant Source Materials and Dopants

| Switching Materials | Dopant Source Materials | Dopants |
| --- | --- | --- |
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN: S | Sulfide Ions |

The thickness of the switching layer in some examples can be about 10 nm or less, about 6 nm or less, about 4 nm or less, about 2 nm or less, or less than 1 nm. For example, the thickness of the switching layer can be about 0.5 nm or less. The conductive layer can be about the same thickness as the switching layer, or can be thicker than the switching layer. For example, the thickness of the conductive layer may range from 2 nm to 200 nm. The electrodes can be made of platinum between about 7 nm and about 100 nm thick, or thicker. In another example, the electrode can be a copper/tantalum nitride/platinum system, where the copper is a very good conductor, and the tantalum nitride acts as a diffusion barrier between the copper and the platinum.

In operation, the conductive layer 120 serves as a reservoir of dopants that can drift into the switching material in the switching layer 110 during switching. FIG. 1 shows a voltage source 150 that can be used to apply an external DC voltage to the memory element. The memory element is switched between an ON state (higher conductivity state) and an OFF state (lower conductivity state) when a higher external DC voltage from a voltage source 150 is applied across the electrodes 130 and 140 to cause dopants to migrate from the conductive layer into the switching layer (ON state), or migrate from the switching layer into the conductive layer (OFF state). The state of the memory element is read when a lower external DC voltage from a voltage source is applied across the electrodes 130 and 140.

Due to the higher dopant concentration, the conductive layer is normally conductive and can contribute minimally to the overall resistance of the memory element. The overall resistance of the memory element can be approximated by the total resistance of the switching layer. Therefore, the overall resistance of a memory element can be increased by increasing the total resistance of the switching layer. In one example, the resistance (R) of the switching layer (i) increases with increasing resistivity (ρ) of the switching material (which can be temperature (T)-dependent), (ii) increases with increasing thickness (l) of the switching layer (along the Z-axis indicated in FIG. 1), and (iii) decreases with the area (A) of the switching layer (computed using the lateral dimensions, i.e., in the x-y plane of the switching layer). In one example, a memory element can be made to have a greater overall resistance by increasing the thickness (l) of the switching layer. In this example, the resistance of the switching layer increases monotonically with increasing thickness of the switching layer. For example, the resistance of the switching layer can increase exponentially with the layer thickness. In other examples, a memory element can be made to have a greater overall resistance by keeping the thicknesses about the same and using a switching material of a higher resistivity, or decreasing at least one of the lateral dimensions of the switching layer (thus reducing A). In yet another example, a memory element can be made to have a greater overall resistance using some combination of increasing the thickness of the switching layer, using a switching material of a higher resistivity, and/or increasing the lateral dimensions of the switching layer.

The memory element is illustrated in FIG. 1 as including a single switching layer 110 and a single conductive layer 120. In another example, the memory element can include more than one switching layer 110 or more than one conductive layer 120. In other examples, the memory element can include multiple switching layers 110 and conductive layers 120.

Figure 2:
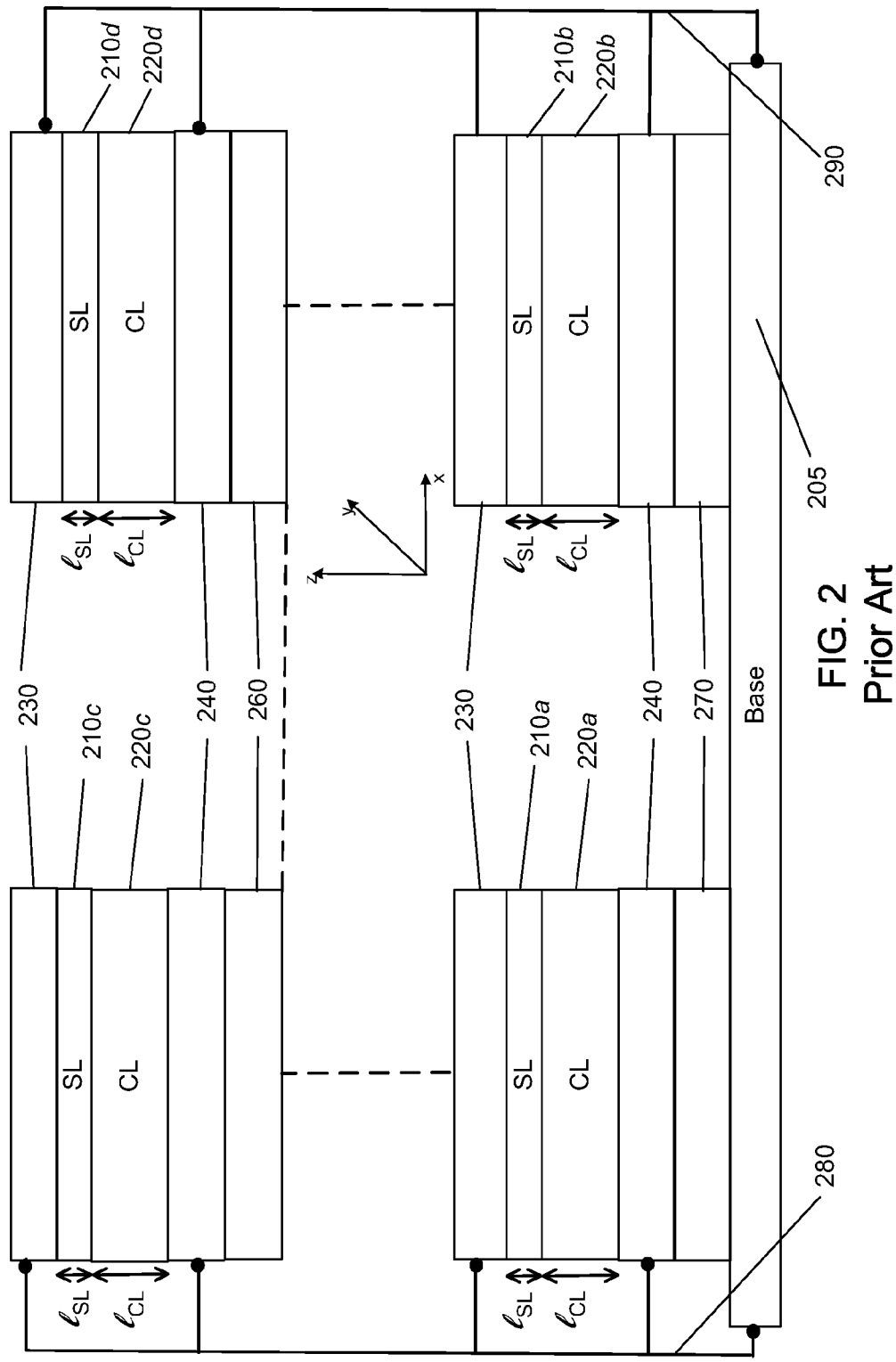
FIG. 2 illustrates an example of memory elements on different layers of a multilayer structure.

FIG. 2 illustrates an example of a multilayer structure (such as but not limited to a memory circuit) that is comprised of interconnected memory elements arranged in a 3D architecture. The multilayer structure includes a base 205, and a multilayer circuit disposed above the base 205. The memory elements in each layer of the multilayer circuit are arranged in an interconnected 2D array. Each memory element includes electrodes 230 and 240, at least one switching layer 210i (i=a, . . . , d), and at least one conductive layer 220i (i=a, . . . , d). Typically, a multilayer structure is made with memory elements having switching layers 210i of approximately equal dimensions. In the example of FIG. 2, the switching layers 210i have similar dimensions in the x-y plane, and approximately equal thicknesses ($l_{SL}$). The memory elements also typically have conductive layers 220i (i=a, . . . , d) of approximately equal lateral dimensions in the x-y plane, and approximately equal thicknesses ($l_{CL}$). Also illustrated in FIG. 2 are conductive lines 280, 290 that lead from the base to the memory elements. Conductive lines 280, 290 provide electrical connectivity between the memory elements and the base 205. In an example, a dielectric layer 260 can be positioned between the memory elements of different layers of the multilayer structure and/or between neighboring memory elements of a layer. In another example, a dielectric layer 270 can be positioned between the memory elements of the lowest memory elements layer and the base 205 of the multilayer structure. The base 205 of the multilayer structure can be integrated with complementary metal-oxide-semiconductor (CMOS) or other conventional computer circuitry. The CMOS circuitry can be configured to selectively address (including applying external voltages to) ones of the memory elements. This CMOS circuitry can provide additional functionality to the multilayer structure such as input/output functions, buffering, logic, or other functionality.

The electrical properties of memory elements can vary depending on their position in a multilayer structure like FIG. 2. As illustrated in FIG. 2, the total length of conductive lines 280, 290 that lead to memory elements in a lower layer of the multilayer structure is less than the total length of conductive lines 280, 290 that lead to memory elements in a higher level.

As a result, the total resistance of the conductive lines 280, 290 that lead to memory elements in the lower layer is less than the total resistance of the conductive lines 280, 290 that lead to memory elements in the higher level. If the memory elements on every level are made to have substantially the same overall resistance (such as for the multilayer structure illustrated in FIG. 2), then their electrical properties can differ for a given external voltage applied to the multilayer structure. Part of the applied external voltage drop across the conductive lines 280, 290 depends on the length (and thus the total resistance) of the conductive lines 280, 290, and the remainder of the voltage drop depends on the resistance of the switching layer of the memory element. The resistance of the switching layer can be much larger than the resistance of the conductive lines 280, 290. As a result, for a given external voltage applied to the multilayer structure, e.g., via the CMOS circuitry in the base, the memory elements positioned in the lower layer of the multilayer structure can be driven at a different internal voltage than the memory elements positioned in the higher layer, which can affect performance.

Systems and methods described herein provide a three dimensional architecture that presents uniform junction resistance across memory elements in the 3D architecture. Described herein are multilayer structures of a plurality of interconnected memory elements, where the active regions of the memory elements are configured to so that the memory elements are driven at uniform internal voltages across the multilayer architecture for a given external voltage applied to the multilayer structure.

Figure 3:
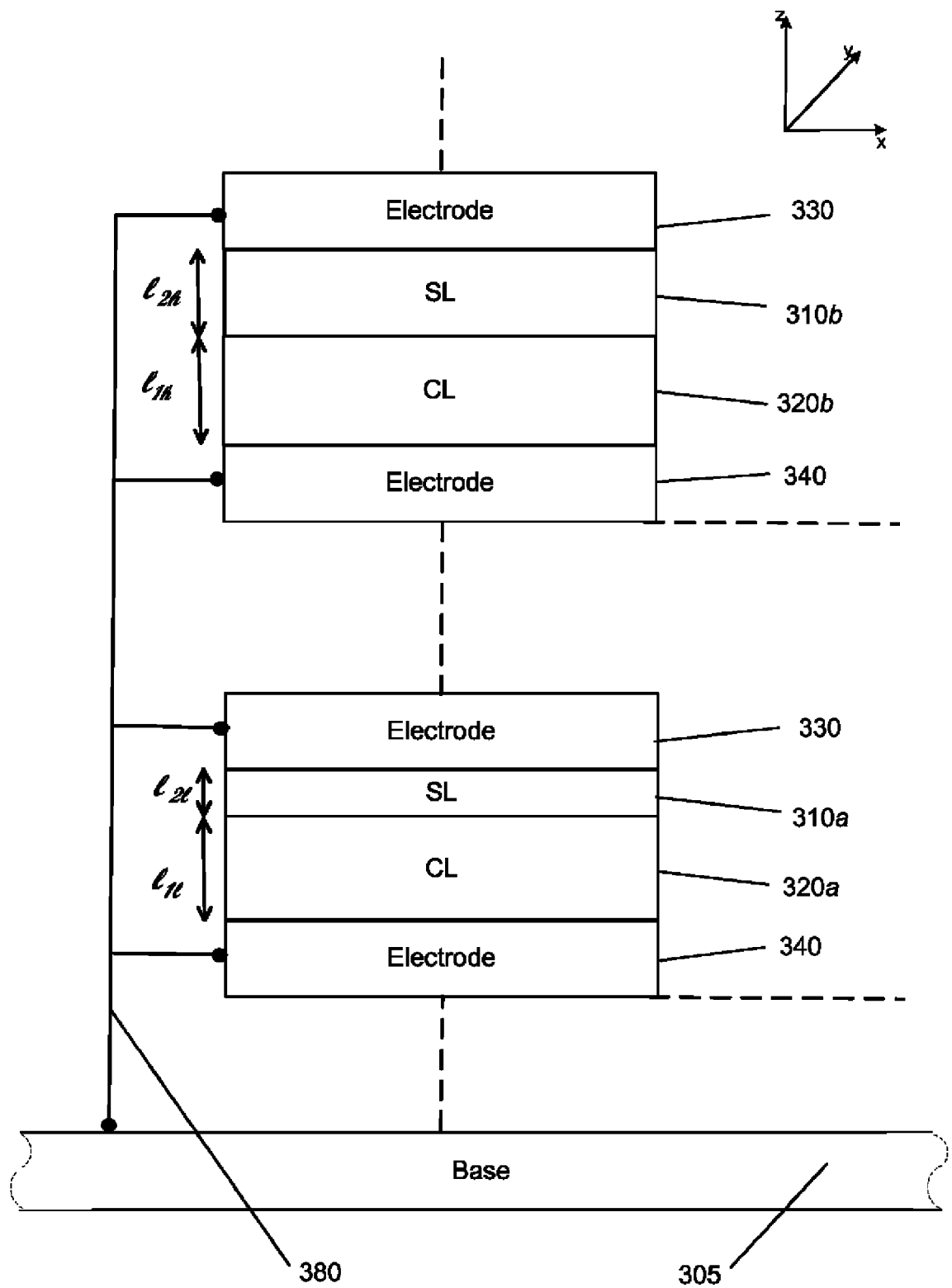
FIG. 3 illustrates an example of memory elements positioned in a multilayer structure according to the principles described herein.

FIG. 3 illustrates an example of a multilayer structure that can present uniform junction resistance across memory elements in the 3D architecture. The multilayer structure includes a base 305, and a multilayer circuit of interconnected memory elements disposed above the base 305 (which can include CMOS circuitry as previously described). The memory elements in each layer of the multilayer circuit are arranged in an interconnected 2D array. The dashed lines in FIG. 3 are used to indicate that other memory elements can be disposed above, below, or in between the memory elements. Each memory element includes electrodes 330 and 340, at least one switching layer 310$i$ (i=a, b), and at least one conductive layer 320$i$ (i=a, b). According to the principles disclosed herein, the memory element of the higher layer is made to have a higher overall resistance than the memory element of the lower layer so that the multilayer structure presents uniform internal voltages across memory elements when the memory elements are driven at similar applied external voltages. In the example of FIG. 3, a dielectric layer (not shown) can be positioned between the memory elements of different layers, between portions of neighboring memory elements of a given layer, and/or between the memory elements of the lowest memory elements layer and the base 305.

The conductive layers 320$a$ and 320$b$ are normally conductive and can contribute minimally to the overall resistance of the memory element. The dopant level, lateral dimensions and thickness ($l_{1i}$ and $l_{2i}$) of the conductive layers 320$a$ and 320$b$ are selected to optimize the performance of the memory elements for a given switching layer used. The overall resistance of a given memory element is controlled using the switching layer. In the example of FIG. 3, the memory elements have approximately equal lateral dimensions, the switching layer 310$b$ of the higher disposed memory element has thickness $l_{2h}$, and the switching layer 310$a$ of the lower disposed memory element has thickness $l_{2l}$. The total resistance of conductive lines 380 leading from the base to the memory element of the higher layer is greater than the total resistance of conductive lines 380 leading from the base to the memory element of the lower layer. In the example of FIG. 3, the memory elements have similar dimensions in the x-y plane, so the thickness $l_{2h}$ of the switching layer 310$b$ is greater than the thickness $l_{2l}$ of switching layer 310$a$ to derive the desired relationship between resistance properties of the memory elements as discussed above. In this example, where the total resistance of conductive lines leading from the base to the higher disposed memory element is greater than the total resistance of conductive lines leading from the base to the lower disposed memory element, the thickness $l_{2h}$ of the switching layer 310$b$ is configured to be greater than the thickness $l_{2l}$ of the switching layer 310$a$ so that the memory elements present uniform electrical properties, including uniform internal voltages, regardless of position in the multilayer structure, for a given external applied voltage. In other examples, the higher disposed memory element can be made to have a greater overall resistance than the lower disposed memory element by keeping the switching layer thicknesses about the same (i.e., $l_{2h} \approx l_{2l}$), but either using a switching material of a higher resistivity in the switching layer of the higher disposed memory element, or decreasing the lateral (x-y plane) dimensions of the switching layer. In yet another example, the higher disposed memory element can be made to have a greater overall resistance using some combination of increasing the thickness of the switching layer, using a switching material of a higher resistivity, and/or decreasing the lateral dimensions of the switching layer. Thus, the example memory elements of FIG. 3 can be driven at similar internal voltages for a given applied external voltage.

Figure 4:
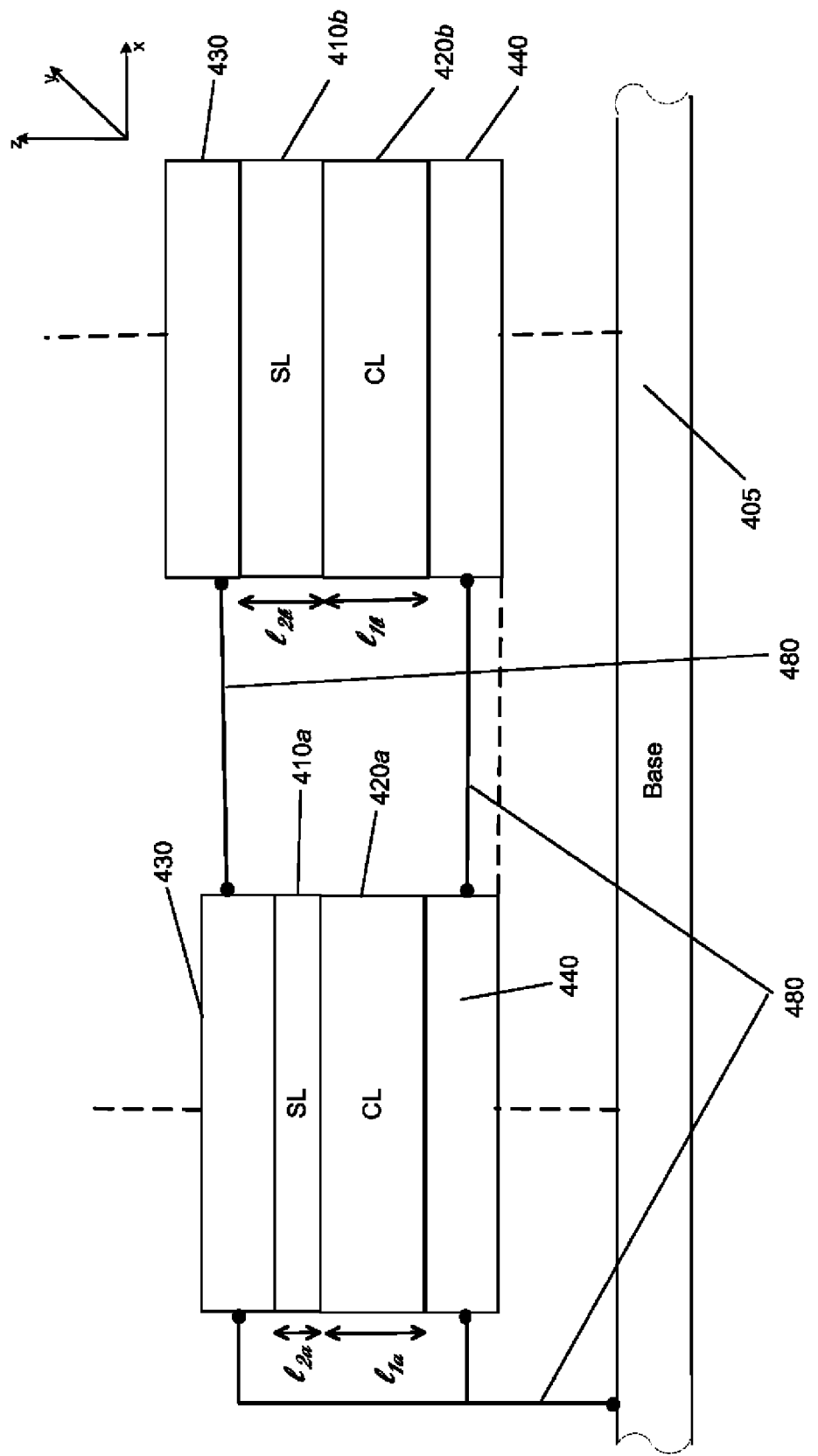
FIG. 4 illustrates another example of memory elements positioned in a multilayer structure according to the principles described herein.

FIG. 4 illustrates another example of a multilayer structure that can present uniform junction resistance across memory elements in the 3D architecture. The multilayer structure includes a base 405, and a multilayer circuit of interconnected memory elements disposed above the base 405 (which can include CMOS circuitry as previously described). The memory elements in each layer of the multilayer circuit are arranged in an interconnected 2D array. The dashed lines in FIG. 4 are also used to indicate that other memory elements can be disposed above, below, or in between the memory elements. In the example of FIG. 3, a dielectric layer (not shown) can be positioned between the memory elements of different layers, between portions of neighboring memory elements of a given layer, and/or between the memory elements of the lowest memory elements layer and the base 405. Each memory element includes electrodes 430 and 440, at least one switching layer 410$i$ (i=a, b), and at least one conductive layer 420$i$ (i=a, b).

The memory elements in the example of FIG. 4 are disposed in the same layer of the multilayer structure. However, the conductive lines are configured in this example so that the total resistance of conductive lines 480 leading from the base to the memory element on the right is greater than the total resistance of conductive lines 480 leading from the base to the memory element on the left. According to the principles disclosed herein, the memory element on the right is made to have a higher overall resistance than the memory element on the right, so that the multilayer structure presents uniform junction resistance across the memory elements. The conductive layers 420$a$ and 420$b$ are can contribute minimally to the overall resistance of the memory element, however, the lateral dimensions and thickness ($l_{1a}$ and $l_{2b}$) of the conductive layers 320$a$ and 320$b$ can selected to optimize the performance of the memory elements. The overall resistance of the memory elements is controlled using the switching layer. In the example of FIG. 4, the memory elements have approximately equal lateral dimensions, the switching layer 410$b$ of the memory element on the right has thickness $l_{2b}$ that is greater than the thickness $l_{2a}$ of switching layer 310a of the memory element on the left to derive the desired relationship between resistance properties of the memory elements. In this example, where the total resistance of conductive lines leading from the base to the memory element on the right is greater than the total resistance of conductive lines leading from the base to the memory element on the left, the thickness $l_{2b}$ of the switching layer 410b is configured to be greater than the thickness $l_{2a}$ of the switching layer 410a so that the memory elements present uniform electrical properties, including uniform internal voltages, regardless of position in the multilayer structure, for a given external applied voltage. In other examples, the memory element on the right can be made to have a greater overall resistance than the memory element on the left by keeping the switching layer thicknesses about the same (i.e., $l_{2b} \approx l_{2a}$), but either using a switching material of a higher resistivity in the switching layer of the higher disposed memory element, or decreasing the lateral (x-y plane) dimensions of the switching layer. In yet another example, the memory element on the right in FIG. 4 can be made to have a greater overall resistance using some combination of increasing the thickness of the switching layer, using a switching material of a higher resistivity, and/or decreasing the lateral dimensions of the switching layer. Thus, the example memory elements of FIG. 4 can be driven at similar internal voltages for a given applied external voltage.

Figure 5:
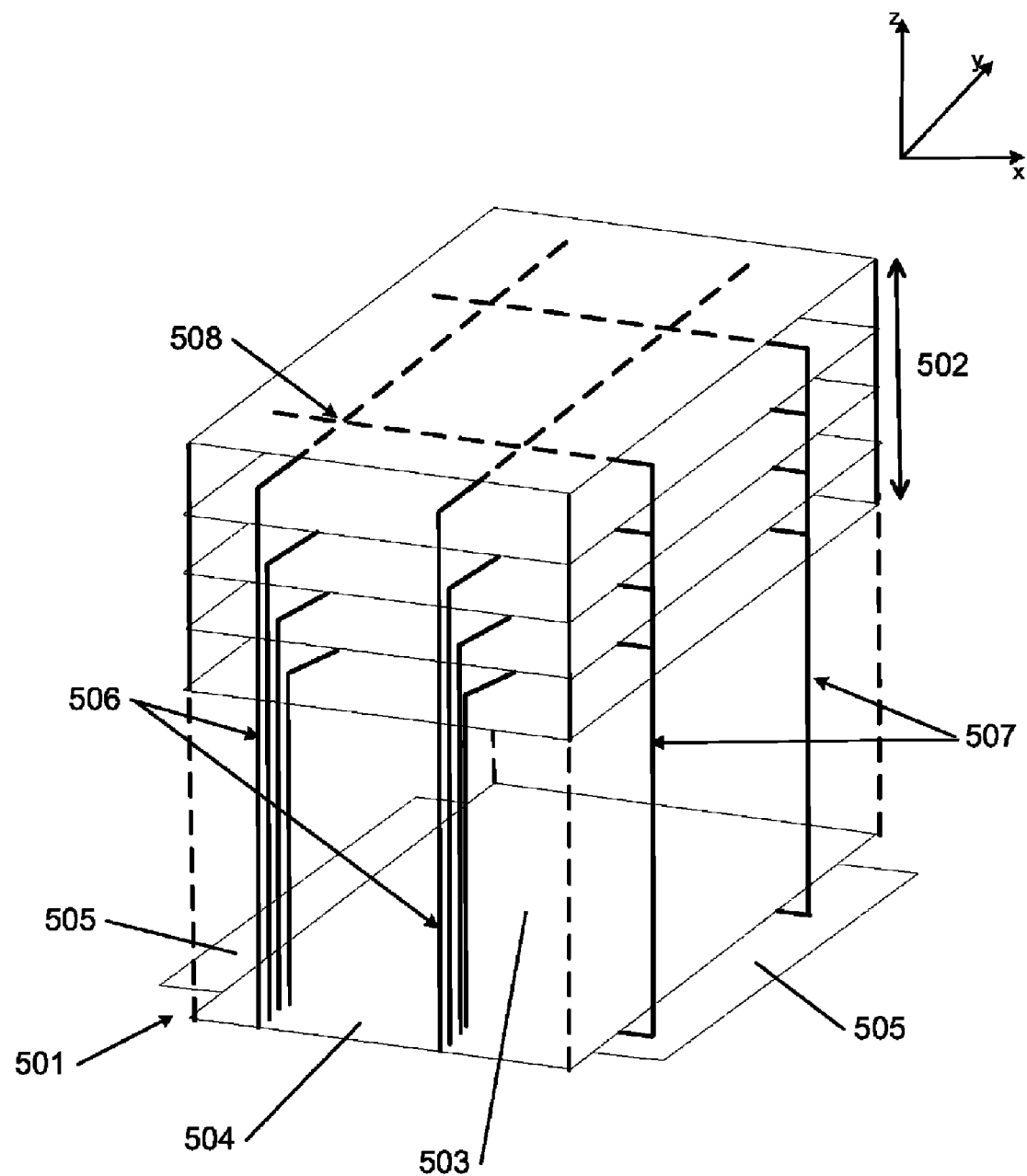
FIG. 5 illustrates an example multilayer structure that includes a crossbar array of memory elements.

FIG. 5 illustrates an example of a multilayer structure to which the principles described herein are applicable. The multilayer structure is configured as a base on which a memory circuit 502 is laminated, with conductive lines 506 and 507 leading from the base to each layer of the multilayer structure. The example of FIG. 5 shows a multilayer structure having edge-disposed conductive lines 506 and 507. Memory elements 508 are positioned in each 2D array on each layer at the intersection of conductive lines 506 and 507. In this example, the base includes a semiconductor substrate 501, a wiring area 503 (such as formed from CMOS circuitry), and contact areas 504 and 505 for the conductive lines. Conductive lines 506 and 507 connect each layer of interconnected memory cells to the wiring area 503 formed on the semiconductor substrate 501. Contact areas 504 and 505 are provided along four edges of the wiring area 503. The memory circuit 502 is illustrated as having four layers of 2D arrays of the interconnected memory elements. However, the memory circuit can include more or fewer than four layers of 2D arrays. The wiring area 503 is provided in the semiconductor substrate 501 below the memory circuit 502. In the wiring area 503, a global bus or the like is used for providing instructions for writing (i.e., putting memory elements to ON or OFF states) or reading from the circuit 502 with outside sources. That is, the external voltage is applied to a memory element using conductive lines 506 and 507. In some examples, wiring area 503 includes a column control circuit including a column switch and/or a row control circuit including a row decoder.

The principles described herein can be applied to the multilayer structure of FIG. 5 as follows. In an example, at least one of the memory elements of a higher layer can be configured to have a higher overall resistance than at least one memory element of a lower layer as previously described (e.g., in connection with FIG. 3). In another example, for memory elements in the same layer, a memory element at a position reached by conductive lines of a higher total resistance (for example but not limited to, conductive lines of a greater total length) can be configured to have a higher overall resistance than a memory element at a position reached by conductive lines of a lower total resistance as previously described (e.g., in connection with FIG. 4). In yet another example, different memory elements of the multilayer structure can be formed using some combination of these two principles (i.e., the principles illustrated and described in connection with FIGS. 3 and 4).

FIG. 5 shows one multilayer structure obtained by laminating a plurality of interconnected memory cells in a direction perpendicular to the semiconductor substrate 501 (z direction shown in FIG. 5). However, an actual structure can include a plurality of multilayer structures arranged in a matrix form in the longitudinal x-direction and/or in the longitudinal y-direction (shown in FIG. 5).

In the example of FIG. 5, conductive lines 506 can be driven independently using the external applied voltage in each layer and conductive lines 507 in all layers are illustrated as connected in common. However, it is also contemplated that conductive lines 507 may be driven independently in each layer using the external applied voltage. Alternatively, conductive lines 506 may be connected in common and conductive lines 507 may be driven independently using the external applied voltage. Further, at least one of conductive lines 506 and conductive lines 507 may be shared by upper and lower layers of the multilayer structure. The CMOS circuitry can be configured to selectively address (including applying external voltages to) ones of the memory elements using the conductive lines 506, 507.

Figure 6B:
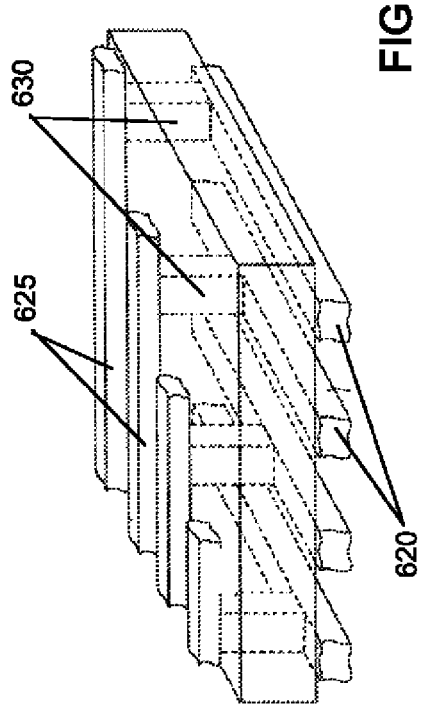
FIG. 6B illustrates a perspective view of the example crossbar array of FIG. 6A.
Figure 6C:
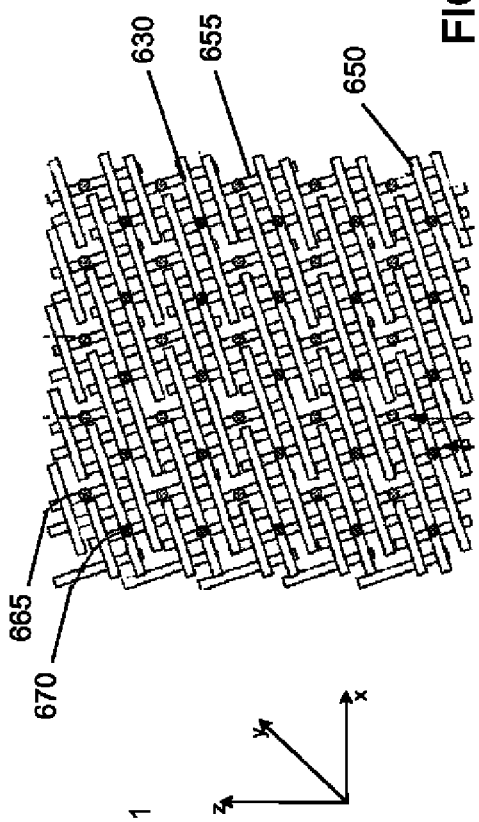
FIG. 6C illustrates a top view of the example crossbar array of FIG. 6A.
Figure 6A:
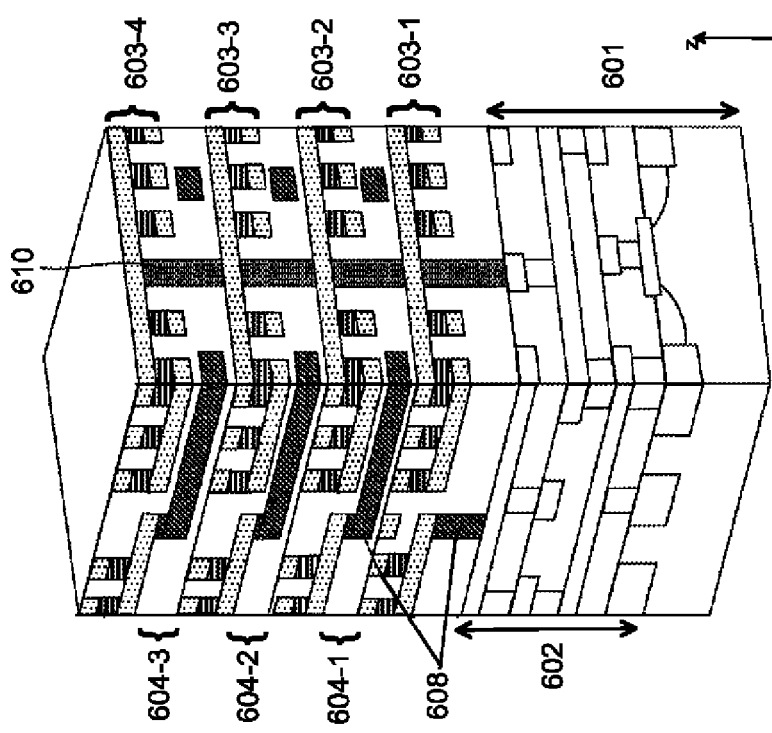
FIG. 6A illustrates an example multilayer structure.

FIG. 6A illustrate another example of a multilayer structure to which the principles described herein are applicable. The multilayer structure 600 includes a base 601 and a multilayer circuit disposed above the base. The base includes a CMOS layer 602. The multilayer circuit includes layers of interconnected memory elements, each layer being formed as a 2D crossbar array 603-i (i=1, . . . , 4). FIG. 6B illustrates a portion of a 2D crossbar array composed of a lower layer of approximately parallel nanowires 620 that are overlain by an upper layer of approximately parallel nanowires 625. The nanowires of the upper layer 625 are roughly perpendicular, in orientation, to the nanowires of the lower layer 620, although the orientation angle between the layers may vary. The two layers of nanowires form a lattice, or crossbar, in which each nanowire of the upper layer 625 overlies all of the nanowires of the lower layer 620. In this example, the memory elements 630 are formed between the crossing nanowires at these intersections. Consequently, each nanowire 625 in the upper layer is connected to every nanowire 620 in the lower layer through a memory element and vice versa. FIG. 6C illustrates a top view of the crossbar array, showing a set of upper crossbar wires (650), a set of lower crossbar wires (655), and a number of programmable memory elements (660) interposed at the intersection between the upper crossbar wires (650) and the lower crossbar wires (655).

Different types of conductive lines form the conductive path that leads from the base to the memory elements of the crossbar arrays of the example multilayer structure of FIG. 6A. One type of conductive line is wiring layers 604-i (i=1, . . . , 3) that are interposed between successive crossbar arrays 603-i (see FIG. 6A). Another type of conductive line that form the conductive path that connects the crossbar array to the base is two groups of vias 608, 610 (see FIG. 6A). A first group of vias 608 connects to the lower crossbar lines (nanowires 620) and a second group of vias 610 connects to the upper crossbar lines (nanowires 625). The second vias 610 pass through all the crossbar arrays 603-i and wiring layers 604-i as a vertical column. In contrast, the locations of the first vias 608 are shifted in each successive wiring layer 604-i. FIG. 6C also shows a top view of the first vias 665 and second vias 670 in the 2D crossbar array. Portions of the nanowires 620, 625 between the memory elements also serve as conductive lines. The use of the conductive lines, including the wiring layers 604-*i*, first vias 608, second vias 610, lower crossbar lines (nanowires 620) and upper crossbar lines (nanowires 625), to uniquely address (including applying voltages to read data and/or to write data (i.e., set to an ON or OFF state)) to the memory elements in the multilayer structure of FIG. 6A-C is described in greater detail in international application no. PCT/US2009/039666, filed Apr. 6, 2009, titled "Three-Dimensional Multilayer Circuit," which is incorporated herein by reference in its entirety. The CMOS circuitry can be configured to selectively address (including applying external voltages to) ones of the memory elements using the conductive lines (including the wiring layers 604-*i*, first vias 608, second vias 610, lower crossbar lines (nanowires 620) and upper crossbar lines (nanowires 625)).

Although individual nanowires (620, 625) in FIG. 6B are shown with rectangular cross sections, nanowires can also have square, circular, elliptical, or more complex cross sections. The nanowires may also have many different widths or diameters and aspect ratios or eccentricities. The crossbar lines may have one or more layers of sub-microscale wires, microscale wires, or wires with larger dimensions, in addition to nanowires.

The principles described herein can be applied to the multilayer structure of FIGS. 6A-C as follows. In an example, at least one of the memory elements of a higher crossbar array can be configured to have a higher overall resistance than at least one memory element of a lower crossbar array as previously described (e.g., in connection with FIG. 3). In another example, for memory elements in the same crossbar array layer, a memory element at a position reached by conductive lines of a higher total resistance (for example but not limited to, conductive lines of a greater total length) can be configured to have a higher overall resistance than a memory element at a position reached by conductive lines of a lower total resistance as previously described (e.g., in connection with FIG. 4). In yet another example, different memory elements of the multilayer structure can be formed using some combination of these two principles (i.e., the principles illustrated and described in connection with FIGS. 3 and 4).

The three dimensional multilayer structures described above could be used in a variety of applications. For example, the multilayer structures could be used as a very high density memory which replaces Dynamic Random Access Memory for computing applications; incorporated into a high density portable storage device that replaces flash memory and other removable storage devices for cell phones, cameras, net book and other portable applications; a very high density storage medium to replace magnetic hard disks and other forms of permanent or semi-permanent storage of digital data; and/or a very high density cache or other memory integrated on top of a computer processor chip to replace Static Random Access Memory. For example, the memory elements described herein can be used in applications using different types of memory, e.g., capacitor, variable capacitor, floating gate transistor, four transistor feed back loop circuit, or magnetic tunnel junction in commercialized DRAM, FeRAM, NOR flash, SRAM or MRAM, technologies, correspondingly. The read/write operations may not be the same for the different types of memories, but in general, e.g., read involves sensing either the charge of a particular memory element or passing current through the memory element.

In sum, the three dimensional multilayer structures described above provides memory circuits having a multilayer architecture of memory elements that present uniform electrical properties, including uniform internal voltages, regardless of position in the multilayer structure for a given external applied voltage. Memory elements that are accessed in the multilayer structure by conductive lines leading from the base with a higher total resistance are configured to have a higher overall resistance than memory elements that are accessed by conductive lines leading from the base with a lower total resistance. A memory element can be made to have a greater overall resistance by increasing the thickness of the switching layer, using a switching material of a higher resistivity, increasing the lateral dimensions of the switching layer, or some combination thereof.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A multilayer structure comprising:
   a base;
   a multilayer circuit disposed above the base, wherein the multilayer circuit comprises multiple layers of memory elements including at least a first memory element and a second memory element; and
   conductive lines leading from the base to the first memory element and the second memory element, wherein a total resistance of conductive lines leading from the base to the second memory element is greater than a total resistance of conductive lines leading from the base to the first memory element, and wherein a resistance of the second memory element is greater than a resistance of the first memory element so as to result in uniform internal voltages across the first and second memory elements for a same applied voltage.

2. The multilayer structure of claim 1, wherein the first memory element comprises a first switching layer and the second memory element comprises a second switching layer, each of the first and second switching layer including a switching material, and wherein the switching material is selected from the group consisting of an oxide of titanium, oxide of hafnium, oxide of zirconium, aluminum nitride, an oxide of silicon, a carbonate of silicon.

3. The multilayer structure of claim 2, wherein the first memory element and the second memory element further comprise at least one conductive layer in contact with the first switching layer and the second switching layer, respectively, and wherein the conductive layer comprises a dopant source material containing dopants that are capable of drifting into the switching layer under an electric field.

4. The multilayer structure of claim 3, wherein the switching material is aluminum nitride, wherein the dopant source material is $AlN_{1-w}$, wherein $0<w\leq0.2$, and wherein the dopants are nitrogen vacancies.

5. The multilayer structure of claim 3, wherein the switching material is an oxide of titanium, wherein the dopant source material is $TiO_{2-x}$, wherein $0<x\leq1$, and wherein the dopants are oxygen vacancies.

6. The multilayer structure of claim 1, wherein the base comprises CMOS circuitry.

7. A multilayer structure comprising:
   a base;
   a multilayer circuit disposed above the base, wherein the multilayer circuit comprises multiple layers of memory elements including at least a first memory element comprising a first switching layer and a second memory element comprising a second switching layer; and conductive lines leading from the base to the first memory element and the second memory element, wherein a total resistance of conductive lines leading from the base to the second memory element is greater than a total resistance of conductive lines leading from the base to the first memory element, and wherein a resistance of the second switching layer is greater than a resistance of the first switching layer, wherein the base comprises CMOS circuitry and a same external voltage is applied to the first memory element and the second memory element using the CMOS circuitry, and wherein the first memory element and the second memory element are driven at a same internal voltage.

8. The multilayer structure of claim 2, wherein the conductive lines are wires leading from the base to the first memory element and the second memory element, wherein a planar area of the first switching layer approximately equals a planar area of the second switching layer, and wherein a thickness of the second switching layer is greater than a thickness of the first switching layer.

9. The multilayer structure of claim 1, wherein the second memory element is positioned in a higher layer of the multilayer structure relative to the base than the first memory element.

10. The multilayer structure of claim 1, wherein the second memory element is positioned in a same layer of the multilayer structure as the first memory element.

11. The multilayer structure of claim 1, further comprising:
a via array comprising a set of first vias and a set of second vias; and
at least two crossbar arrays configured to overlie the base, wherein the at least two crossbar arrays form at least two intersections, wherein the first memory element and the second memory element are positioned at different intersections, and
wherein the conductive lines leading from the base to the first memory element and the second memory element comprise at least one first via, at least one second via, and at least two crossbar lines of the at least two crossbar arrays.

12. The multilayer structure of claim 11, wherein a planar area of the first switching layer approximately equals a planar area of the second switching layer, and wherein a thickness of the second switching layer is greater than a thickness of the first switching layer.

13. The multilayer structure of claim 12, wherein the multilayer structures is used as a dynamic random access memory, a flash memory, memory for a cell phone, memory for a camera, memory for a net book computer, or a static random access memory.

14. A multilayer structure comprising:
a via array comprising a set of first vias and a set of second vias;
a CMOS layer to selectively address the set of first vias and the set of second vias;
at least two crossbar arrays configured to overlie the CMOS layer and communicate with at least one of the first vias and the second vias, each of the at least two crossbar arrays intersect at a plurality of intersections; and
memory elements configured to be interposed at the intersections, wherein:
a first memory element and a second memory element are positioned at different intersections of the plurality of intersections,
the conductive lines leading from the base to the first memory element and the second memory element comprise at least one first via, at least one second via, and at least two crossbar lines of the at least two crossbar arrays,
a total resistance of conductive lines leading from the base to the second memory element is greater than a total resistance of conductive lines leading from the base to the first memory element, and
a resistance of the second memory element is greater than a resistance of the first memory element so as to result in uniform junction resistance across the first and second memory elements.

15. The multilayer structure of claim 14, wherein the first memory element comprises a first switching layer and the second memory element comprises a second switching layer, each of the first and second switching layers including a switching material, and wherein the switching material is selected from the group consisting of an oxide of titanium, oxide of hafnium, oxide of zirconium, aluminum nitride, an oxide of silicon, a carbonate of silicon.

16. The multilayer structure of claim 15, wherein the first memory element and the second memory element further comprise at least one conductive layer in contact with the first switching layer and the second switching layer, respectively, and wherein the conductive layer comprises a dopant source material containing dopants that are capable of drifting into the switching layer under an electric field.

17. The multilayer structure of claim 16, wherein the switching material is aluminum nitride, wherein the dopant source material is $AlN_{1-w}$, wherein $0<w\leqq0.2$, and wherein the dopants are nitrogen vacancies.

18. The multilayer structure of claim 16, wherein the switching material is an oxide of titanium, wherein the dopant source material is $TiO_{2-x}$, wherein $0<x\leqq1$, and wherein the dopants are oxygen vacancies.

19. The multilayer structure of claim 15, wherein a planar area of the first switching layer approximately equals a planar area of the second switching layer, and wherein a thickness of the second switching layer is greater than a thickness of the first switching layer.

20. The multilayer structure of claim 14, wherein the second memory element is positioned in a higher layer of the multilayer structure relative to the base than the first memory element.

21. The multilayer structure of claim 14, wherein the second memory element is positioned in a same layer of the multilayer structure as the first memory element.

* * * * *